United States Patent
Deval et al.

(10) Patent No.: US 7,091,785 B2
(45) Date of Patent: Aug. 15, 2006

(54) LOAD AND LINE REGULATION USING OPERATIONAL TRANSCONDUCTANCE AMPLIFIER AND OPERATIONAL AMPLIFIER IN TANDEM

(75) Inventors: Philippe Deval, Lutry (CH); Maher Kayal, St-Sulpice (CH); Fabien Vaucher, Bussigny (CH)

(73) Assignee: Microchip Technology Inc., Chandler, AZ (US)

( * ) Notice: Subject to any disclaimer, the term of this patent is extended or adjusted under 35 U.S.C. 154(b) by 0 days.

(21) Appl. No.: 10/857,332

(22) Filed: May 28, 2004

(65) Prior Publication Data

US 2004/0246052 A1   Dec. 9, 2004

Related U.S. Application Data

(60) Provisional application No. 60/477,143, filed on Jun. 9, 2003.

(51) Int. Cl.
*H03F 3/45* (2006.01)

(52) U.S. Cl. ...................................................... 330/253

(58) Field of Classification Search ................ 330/252, 330/253
See application file for complete search history.

(56) References Cited

U.S. PATENT DOCUMENTS

| | | | |
|---|---|---|---|
| 4,333,058 A * | 6/1982 | Hoover | 330/253 |
| 5,625,317 A | 4/1997 | Deveirman | 327/353 |
| 5,880,634 A * | 3/1999 | Babanezhad | 330/107 |
| 6,700,522 B1 * | 3/2004 | Ivanov et al. | 330/107 |
| 2002/0003441 A1 | 1/2002 | Steensgaard-Madsen | 327/54 |
| 2003/0085763 A1 | 5/2003 | Schrodinger et al. | 330/253 |

OTHER PUBLICATIONS

Patent Cooperation Treaty, Oct. 20, 2004.

* cited by examiner

*Primary Examiner*—Khanh Van Nguyen
(74) *Attorney, Agent, or Firm*—Baker Botts L.L.P.

(57) ABSTRACT

An electronic amplifier circuit comprising an operational amplifier circuit, such as a two-stage operational amplifier circuit, in tandem with a operational transconductance amplifier. The electronic amplifier circuit has high open-loop gain and high gain-bandwidth while maintaining stability over a wide range of operating parameters.

9 Claims, 4 Drawing Sheets

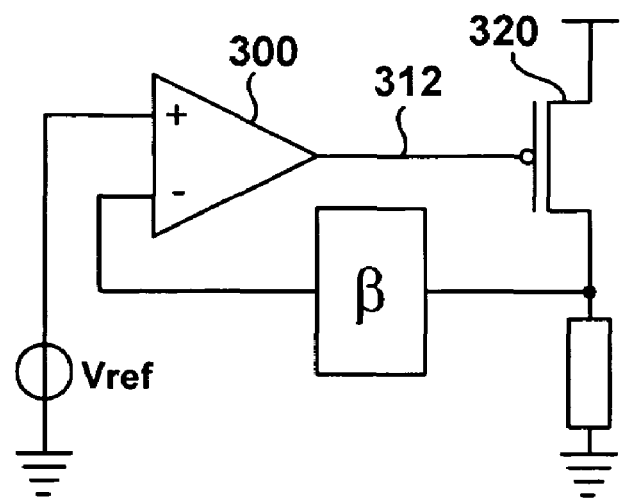
Figure 1 *(Prior Art)*
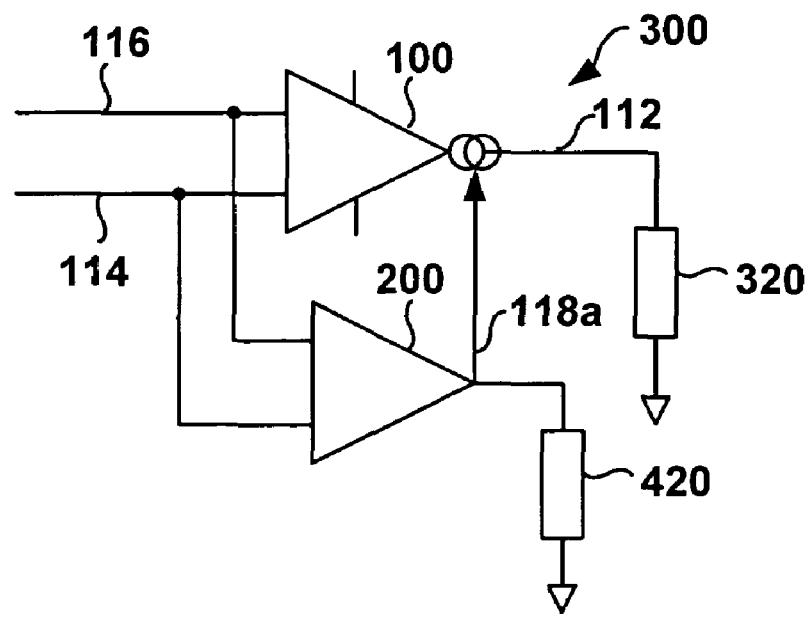
Figure 2

LOAD AND LINE REGULATION USING OPERATIONAL TRANSCONDUCTANCE AMPLIFIER AND OPERATIONAL AMPLIFIER IN TANDEM

RELATED PATENT APPLICATION

This application claims priority to commonly owned U.S. Provisional Patent Application Ser. No. 60/477,143; filed Jun. 9, 2003; entitled "Tandem of OTA and OpAmp for Load & Line Regulation Improvement," by Philippe Deval, Maher Kayal and Fabien Vaucher, which is hereby incorporated by reference herein for all purposes.

FIELD OF THE INVENTION

The present invention relates generally to operational amplifier circuits, and more particularly to high gain and high bandwidth operational amplifier circuits.

BACKGROUND OF THE INVENTION TECHNOLOGY

Electronic regulator loops, e.g., voltage, etc., often use a power output device controlled by an operational amplifier in a feed-back loop (see FIG. 1). In order to achieve an accurate output value, both high gain and wide bandwidth are required in the loop. High gain improves the output line, e.g., voltage, regulation and wide bandwidth improves the response time to a sudden load change. However, high gain and wide bandwidth operational amplifier circuits pose stability problems. Existing approaches to obtaining stable high gain regulators having good regulation have been the use of gain boosting operational amplifier circuits, and/or nested operational amplifier circuits. The stability of the gain boosting operational amplifier circuits depends upon the external load characteristics. The nested operational amplifier circuit are stable because they have limited bandwidth, and thus produce poor load regulation.

Increased use of rechargeable high technology batteries such as Lithium Ion in electronic equipment have increased the desire for lower cost and higher performance voltage regulator and battery charging circuits requiring high-gain and high bandwidth error amplifiers in the control loops. Voltage converters also require high performance voltage regulators in their control loops.

Therefore, what is needed is an electronic amplifier circuit that enables improved line and load regulation at the same time. Preferably this electronic amplifier will achieve good stability while maintaining high gain (reduced loop error) and wide bandwidth (fast response to a load change.

SUMMARY OF THE INVENTION

The invention overcomes the above-identified problems as well as other shortcomings and deficiencies of existing technologies by providing an electronic amplifier circuit having high open-loop gain and high gain-bandwidth while maintaining stability over a wide range of operating parameters. The invention electronic amplifier circuit may be effectively used in battery chargers, DC to DC converters, low drop out (LDO) voltage regulators, and the like. The invention electronic amplifier circuit allows highly stabile and precisely regulated output voltages.

The invention electronic amplifier circuit comprises an operational transconductance amplifier (OTA) coupled with an operational amplifier (OA) to produce a wide-bandwidth, high-gain amplifier circuit that may be used in a closed loop voltage regulator having both wide bandwidth and high gain, and is stable over all operating conditions. The OA may be, for example, a cascade of two OTA (two-stage OTA), a three stage amplifier and the like. The OA has a high gain but limited bandwidth. The OTA has a large (wide) bandwidth but limited gain. Thus, the OTA provides high bandwidth while the OA provides high open-loop gain.

FIG. 2 depicts an OTA 100 and an OA 200 coupled together to achieve both high bandwidth and high open loop gain. The OTA 100 has high bandwidth and is in the main signal path. However, the OTA 100 has low gain, therefore it may induce a significant static error in a closed loop configuration. The OA 200 may be used to monitor the offset of the high bandwidth OTA 100 as a function of the differential voltage between the input nodes 114 and 116. The OA 200 may be connected in such a way that in a closed loop configuration the offset of the OTA 100 is substantially cancelled. A low frequency static error is considered as an offset by the OA 200 and thus is cancelled or reduced to a very low level.

A technical advantage of the invention is good stability over a widely varying range of loads and rapidly changing load characteristics. Yet another technical advantage is reduced power consumption for improved operating characteristics. Another technical advantage is increased gain-bandwidth.

Features and advantages of the invention will be apparent from the following description of the embodiments, given for the purpose of disclosure and taken in conjunction with the accompanying drawing.

BRIEF DESCRIPTION OF THE DRAWING

A more complete understanding of the present disclosure and advantages thereof may be acquired by referring to the following description taken in conjunction with the accompanying drawing, wherein:

FIG. 1 illustrates a prior art block diagram of an electronic voltage regulator having an output power device controlled by an operational amplifier in a feedback loop;

FIG. 2 illustrates a schematic block diagram of a high-gain, wide-bandwidth operational amplifier, according to an exemplary embodiment;

Figure 3:
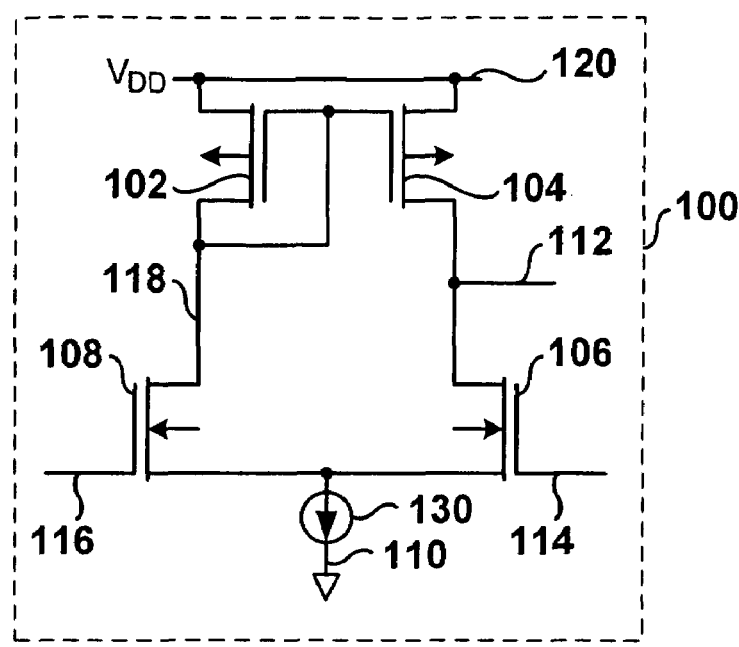
FIG. 3 illustrates a schematic diagram of an exemplary embodiment of an operational transconductance amplifier (OTA)

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Referring now to the drawings, the details of exemplary embodiments of the present invention are schematically illustrated. Like elements in the drawing will be represented by like numbers, and similar elements will be represented by like numbers with a different lower case letter suffix.

Referring to FIG. 2, depicted is a schematic block diagram of a high-gain, wide-bandwidth operational amplifier, according to an exemplary embodiment, and is generally represented by the numeral 300. The high-gain, wide-bandwidth operational amplifier 300 comprises an operational transconductance amplifier (OTA) 100 and a two-stage operational amplifier 200 (amplifier 200 also may be a three stage amplifier and the like) coupled together as more fully described hereinafter (see FIGS. 3, 4, 5 and 6). The amplifier 300 is stable over a wide range and nature of the load impedance 320, and preferably has a phase margin of at least 70 degrees, preferably over a load capacitance of from about one picofarad to about ten nanofarads.

Referring to FIG. 3, depicted is a schematic diagram of an exemplary embodiment of an operational transconductance amplifier (OTA) that may be used for the OTA 100 depicted in FIG. 2. The OTA 100 has a current output 112 controlled by a differential input voltage between inputs 114 and 116. The output current is proportional to the voltage difference between the differential inputs 114 and 116 and the transconductance ($g_M$) of the OTA 100.

The inputs 114 and 116 are coupled to the gates of transistors 106 and 108, respectively, and are adapted to receive differential voltage inputs. Transistor 102 is a current mirror to transistor 104. The drain of transistor 108 is connected to the input 118 of the current mirror formed by transistors 102 and 104. The drains of transistors 104 and 106 form the current output 112. Current source 130 is connected between transistors 106 and 108, and common or ground 110. Transistors 102 and 104 are also connected to a positive supply voltage, $V_{DD}$, 120. The OTA 100 is characterized as having limited gain, but a wide (large) bandwidth. The current source 130 may also be a constant current source.

Figure 4:
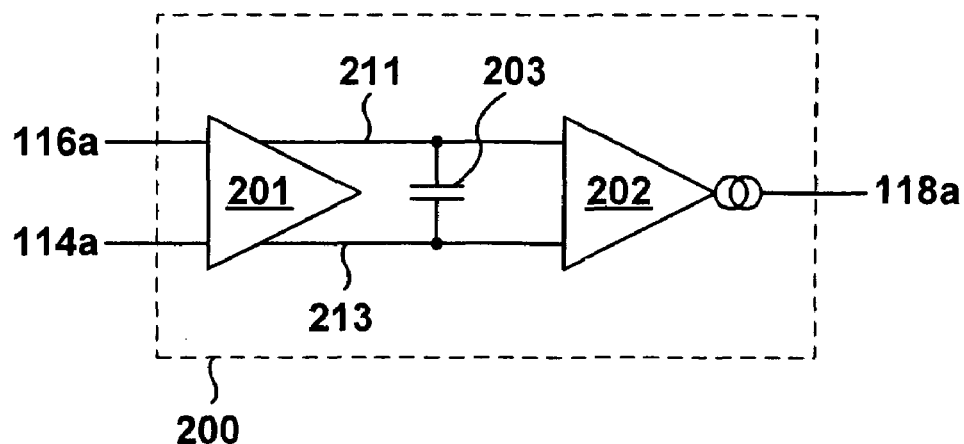
FIG. 4 illustrates a schematic block diagram of an exemplary embodiment of a two-stage low bandwidth operational amplifier.

Referring to FIG. 4, depicted is a schematic block diagram of an exemplary embodiment of a two-stage operational amplifier that may be used for the two-stage operational amplifier 200 depicted in FIG. 2. The two-stage operational amplifier 200 comprises cascade connected OTA 201 and OTA 202, and a compensation capacitor 203. The compensation capacitor 203 provides phase stability at both high and low gains. The two-stage operational amplifier 200 may be characterized as having high gain, but a limited bandwidth. It is contemplated and within the scope of the invention that the two-stage operational amplifier 200 also may be comprised of a three stage amplifier and the like (not shown).

Figure 5:
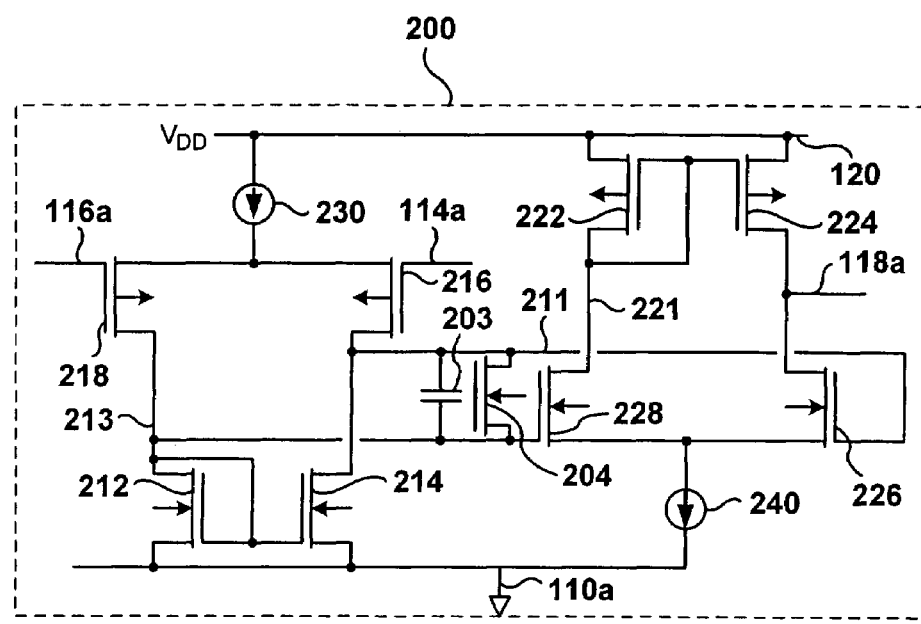
FIG. 5 illustrates a schematic diagram of an exemplary embodiment of a two-stage operational amplifier.

Referring to FIG. 5, depicted is a schematic diagram of an exemplary embodiment of a two stage operational amplifier that may be used for the two-stage operational amplifier 200 shown in FIG. 4. In order to improve 1/f noise performance, a P-type differential input pair may be used for the first OTA 201 (transistors 216, 218, 212 and 214) while the OTA 202 (transistors 222, 224, 226 and 228) may be similar to the OTA 100 shown in FIG. 3.

The inputs 114a and 116a of the first OTA 201 are coupled to the gates of transistors 216 and 218, respectively, and are adapted to receive differential voltage inputs. Current source 230 is connected between transistors 216 and 218, and the positive supply voltage, $V_{DD}$, 120. Transistor 212 is a current mirror to transistor 214. The drain of transistor 218 is connected to the input 213 of the current mirror formed by transistors 212 and 214. The drains of transistors 214 and 216 form the current output 211 of the first OTA 201. Transistors 212 and 214 are also connected to common or ground 110a.

Nodes 211 and 213 are coupled to the gates of transistors 226 and 228, respectively, and are adapted to receive differential voltage inputs. Current source 240 is connected between transistors 226 and 228, and common or ground 110a. Transistor 222 is a current mirror to transistor 224. The drain of transistor 228 is connected to the input 221 of the current mirror formed by transistors 222 and 224. The drains of transistors 224 and 226 form the current output 118a of the second OTA 202. Transistors 222 and 224 are also connected to the positive supply voltage, $V_{DD}$, 120. The compensation capacitor 203 is connected between nodes 211 and 213. A transistor 204 may be used to clamp voltage swing.

Figure 6:
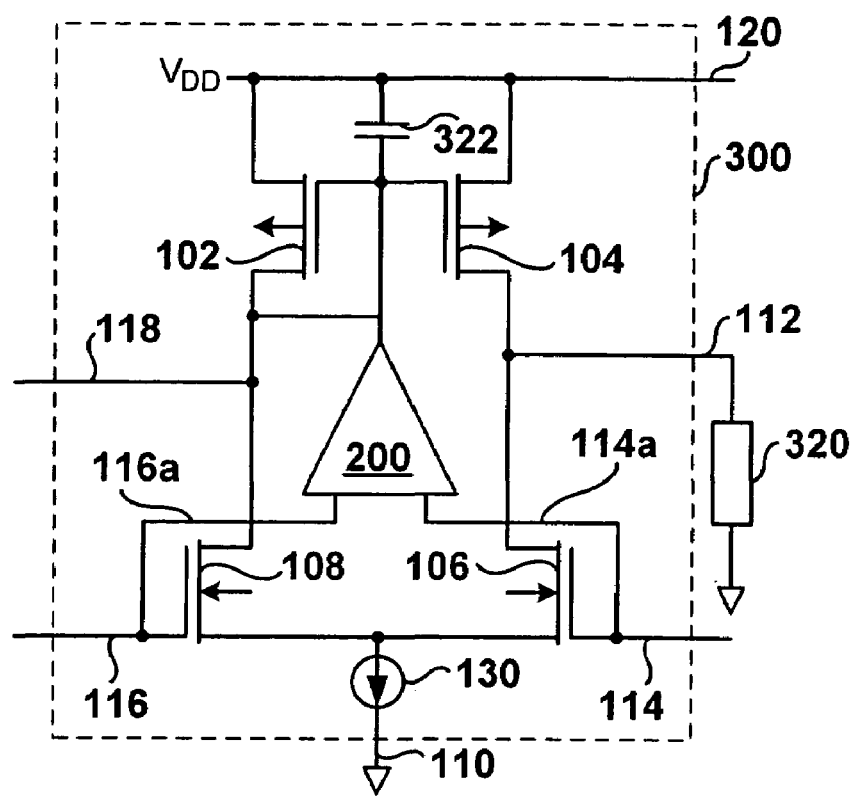
FIG. 6 illustrates a schematic diagram of a high-gain, wide-bandwidth operational amplifier, according to an exemplary embodiment.

Referring to FIG. 6, depicted is a schematic diagram of an exemplary embodiment of a high-gain, wide-bandwidth operational amplifier, according to a combination of the circuits shown in FIGS. 3, 4 and 5. The amplifier 300 may comprise the OTA 100 shown in FIG. 3 in combination with the two-stage operational amplifier 200 shown in FIGS. 4 and 5 (amplifier 200 also may be a three stage amplifier and the like). The output 112 of the amplifier 300 is coupled to a load impedance 320, e.g., the output power device. Inputs 114 and 116 are adapted to receive a differential voltage input signal. The inputs 114 and 116 are coupled to the gates of transistors 106 and 108, respectively, and are adapted to receive the differential voltage inputs. Transistor 102 is a current mirror to transistor 104. The junction of transistors 104 and 106 form the current output 112. Current source 130 is connected between transistors 106 and 108, and common or ground 110. Transistors 102 and 104 are also connected to a positive supply voltage, $V_{DD}$, 120. The output 118a of the amplifier 200 is coupled to the gates of the transistors 302 and 304, and the inputs 114a and 116a of the amplifier 200 are coupled to the inputs 114 and 116, respectively. An impedance 420 (FIG. 2) is proportional to the reciprocal of the sum of the transconductance of transistor 102 and $j\omega C_p$, were Cp is a parasitic capacitance depicted as capacitor 322.

Amplifier 200, depicted in FIG. 5, alternatively, may be differentially coupled to nodes 118 and 112. However, the connections of the amplifier 200 depicted in FIG. 5 may reduce the requirements on the dynamic range of the amplifier 200 output. Moreover it allows use of the node 118 as an extra input that may be used to perform the current limitation and/or temperature protection of a voltage regulator implemented with the exemplary embodiments disclosed herein.

The invention amplifier 300 may be fabricated on an integrated circuit (not shown). The integrated circuit may also comprise other analog and/or digital circuits, including but not limited to a digital processor. The digital processor may be a microprocessor, a microcontroller, a programmable logic array (PLA), an application specific integrated circuit (ASIC) and the like. It is contemplated and within the scope of the invention that the amplifier 300 may be used advantageously in voltage and current regulation applications, battery chargers, power management, low dropout power regulators, DC to DC converters and the like.

It is contemplated and within the scope of the invention that the current sources (e.g., 130, 230 and 240) may be a constant current source, a PTAT current source, an inverse PTAT current source, and the like.

The invention, therefore, is well adapted to carry out the objects and attain the ends and advantages mentioned, as well as others inherent therein. While the invention has been depicted, described, and is defined by reference to exemplary embodiments of the invention, such a reference does not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An electronic amplifier, comprising:
    a first operational transconductance amplifier (OTA) having differential inputs and an output; and
    a two stage operational amplifier (OA) having differential inputs and an output, the two stage operational amplifier comprises:
        a second OTA having differential inputs and differential outputs; and
        and a third OTA having differential inputs and an output;
        wherein the differential outputs of the second OTA are connected to the differential inputs of the third OTA;
        whereby the differential inputs of the second OTA are the differential inputs of the OA and the output of the third OTA is the output of the OA;
    wherein the differential inputs of the OA are connected in parallel with the differential inputs of the first OTA and the output of the OA is connected to the first OTA so as to minimize offset in the first OTA.

2. The electronic amplifier of claim 1, further comprising a compensation capacitor connected to the differential outputs of the second OTA and the differential inputs of the third OTA.

3. The electronic amplifier of claim 2, wherein the compensation capacitor provides phase stability for the two stage operational amplifier comprising the second and third OTAs.

4. An electronic amplifier, comprising:
    an operational transconductance amplifier (OTA) having differential inputs and an output; and
    an operational amplifier (OA) having differential inputs and an output, wherein the differential inputs of the OA are connected in parallel with the differential inputs of the OTA and the output of the OA is connected to the OTA so as to minimize offset in the OTA;
    wherein the OTA comprises:
        a first transistor having a first gate, a first source and a first drain;
        a second transistor having a second gate, a second source and a second drain;
        a third transistor having a third gate, a third source and a third drain;
        a fourth transistor having a fourth gate, a fourth source and a fourth drain; and
        a first current source;
        wherein:
            the first current source is connected between a voltage source common and the third and fourth sources,
            the third and fourth sources are connected together,
            the fourth drain is connected to the first drain, and the first and second gates,
            the second drain is connected to the third drain and the second and third drains are adapted as an output of the electronic amplifier,
            the first and second sources are connected to a voltage source,
            the third gate is adapted as a first differential input of the electronic amplifier,
            the fourth gate is adapted as a second differential input of the electronic amplifier; and
        wherein the output of the OA is connected to the first drain, and first and second gates of the OTA so as to minimize offset in the OTA.

5. The electronic amplifier of claim 4, further comprising a parasitic capacitance between the first and second gates and the voltage source.

6. The electronic amplifier of claim 4, further comprising a current limitation control input connected to the first and fourth drains, and the first and second gates.

7. The electronic amplifier of claim 4, further comprising a temperature protection control input connected to the first and fourth drains, and the first and second gates.

8. The electronic amplifier of claim 4, wherein the first and second transistors are P-channel field effect transistors, and the third and fourth transistors are N-channel field effect transistors.

9. The electronic amplifier of claim 4, wherein the first current source is selected from the group consisting of a constant current source, a proportional to absolute temperature (PTAT) current source, and an inverse PTAT current source.

* * * * *